(12) United States Patent
Kessler et al.

(10) Patent No.: US 11,848,262 B2
(45) Date of Patent: Dec. 19, 2023

(54) SEMICONDUCTOR PACKAGE AND PASSIVE ELEMENT WITH INTERPOSER

(71) Applicant: Infineon Technologies AG, Neubiberg (DE)

(72) Inventors: Angela Kessler, Sinzing (DE); Robert Carroll, Andover, MA (US); Robert Fehler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 194 days.

(21) Appl. No.: 17/176,678

(22) Filed: Feb. 16, 2021

(65) Prior Publication Data

US 2022/0262716 A1 Aug. 18, 2022

(51) Int. Cl.
*H01L 23/498* (2006.01)
*H01L 25/07* (2006.01)
*H01L 21/48* (2006.01)
*H01L 23/00* (2006.01)

(52) U.S. Cl.
CPC .... *H01L 23/49844* (2013.01); *H01L 21/4853* (2013.01); *H01L 24/16* (2013.01); *H01L 25/072* (2013.01); *H01L 2224/16227* (2013.01); *H01L 2924/19104* (2013.01)

(58) Field of Classification Search
CPC ........... H01L 23/49844; H01L 21/4853; H01L 24/16; H01L 25/072; H01L 2224/16227; H01L 2924/19104; H01L 25/16; H01L 23/49822; H01L 23/5384; H01L 23/5386; H01L 25/18
See application file for complete search history.

(56) References Cited

U.S. PATENT DOCUMENTS

| | | | |
|---|---|---|---|
| 10,256,189 B2 | 4/2019 | Dosluoglu | |
| 10,586,750 B2 | 3/2020 | Sinning | |
| 10,802,518 B1 | 10/2020 | Uo et al. | |
| 10,818,646 B2 | 10/2020 | Palm et al. | |
| 2011/0157857 A1* | 6/2011 | Matsumoto | H05K 1/0224 361/803 |
| 2019/0296645 A1 | 9/2019 | Zhou et al. | |

* cited by examiner

*Primary Examiner* — Elias Ullah
(74) *Attorney, Agent, or Firm* — Murphy, Bilak & Homiller, PLLC (57) ABSTRACT

A semiconductor assembly includes an interposer that includes an insulating substrate, a plurality of upper contact pads on an upper surface of the substrate, and a plurality of lower contact pads on a lower surface of the substrate, a semiconductor package that includes a semiconductor die embedded within a package body and a plurality of package terminals exposed from the package body, a first passive electrical element that includes first and second terminals, a first electrical connection between the first terminal of the first passive electrical element and a first one of the lower contact pads via the interposer, a second electrical connection between the second terminal of the first passive electrical element and a first one of the package terminals, and a third electrical connection between a second one of the package terminals and a second one of the lower contact pads via the interposer.

17 Claims, 10 Drawing Sheets

SEMICONDUCTOR PACKAGE AND PASSIVE ELEMENT WITH INTERPOSER

BACKGROUND

Power modules are used an many applications such as automotive and industrial applications. A power module may include power devices that are rated to control large voltages and/or currents, e.g., MOSFETs (metal oxide semiconductor field effect transistors), IGBTs (insulated gate bipolar transistors), diodes, etc., and driver devices that are configured to control the power devices. A power module may also include passive electric elements, e.g., inductors, capacitors, etc., that enhance performance, e.g., power efficiency, switching speed, etc. It is desirable to provide a power module with high performance, e.g., high peak efficiency and a high load efficiency, while maintaining a small areal footprint and having robust electrical interconnections.

SUMMARY

A semiconductor assembly is disclosed. According to an embodiment, the semiconductor assembly comprises an interposer that comprises an electrically insulating substrate, a plurality of upper contact pads disposed on an upper surface of the substrate, and a plurality of lower contact pads disposed on a lower surface of the substrate that is opposite from the upper surface, a semiconductor package that comprises a semiconductor die embedded within a package body and a plurality of package terminals that are exposed from the package body, a first passive electrical element that comprises first and second terminals, a first electrical connection between the first terminal of the first passive electrical element and a first one of the lower contact pads via the interposer, a second electrical connection between the second terminal of the first passive electrical element and a first one of the package terminals, and a third electrical connection between a second one of the package terminals and a second one of the lower contact pads via the interposer.

Separately or in combination, the semiconductor package is mounted on the interposer such that the package terminals face and electrically connect with a group of the upper contact pads.

Separately or in combination, the first passive electrical element is a discrete passive electrical element that is disposed over and overlaps with the semiconductor package.

Separately or in combination, the first electrical connection comprises a first conductive connector that vertically extends between a first one of the upper contact pads and a lower surface of the first passive electrical element, and the first one of the upper contact pads is electrically connected to the first one of the lower contact pads via the interposer.

Separately or in combination, the second electrical connection comprises a second conductive connector that vertically extends between a second one of the upper contact pads and the lower surface of the first passive electrical element, and wherein the second one of the upper contact pads is electrically connected to the first one of the package terminals via the interposer.

Separately or in combination, the first one of the package terminals is disposed on an upper side of the semiconductor package that faces away from the interposer.

Separately or in combination, the semiconductor package comprises first and second outer edge sides that are opposite to one another, wherein the first one of the package terminals is disposed closer to the second outer edge side, and the first outer edge side faces the first conductive connector.

Separately or in combination, the semiconductor package comprises first and second outer edge sides that are opposite to one another, wherein the first one of the package terminals is disposed closer to the second outer edge side, and the second outer edge side faces the first conductive connector.

Separately or in combination, the second electrical connection comprises a second conductive connector that vertically extends between a second one of the upper contact pads and the lower surface of the first passive electrical element, and the second one of the upper contact pads is electrically connected to the first one of the package terminals by a first conductive clip that is disposed outside of the semiconductor package.

Separately or in combination, the second electrical connection comprises a second conductive connector that directly contacts the first one of the package terminals, and the second conductive connector comprises a lateral section that extends across a first outer edge side of the semiconductor package and a vertical section that extends from the lateral section to the lower surface of the first passive electrical element.

Separately or in combination, the semiconductor assembly further comprises a second passive electrical element that is mounted on an upper surface of the semiconductor package, and the first passive electrical element is disposed over and spaced apart from the second passive electrical element.

Separately or in combination, the first passive electrical element is integrally formed in the interposer.

Separately or in combination, the semiconductor package comprises a pair of power switching devices which form the high-side switch and low-side switch of a half-bridge circuit and a driver die configured to control the power switching devices, and the first passive electrical element is an inductor that is connected in series between an output of the half-bridge circuit and the circuit carrier.

Separately or in combination, the semiconductor package comprises a conductive metal clip disposed on an upper surface of the semiconductor package that is opposite from the interposer, and the conductive metal clip forms an electrical interconnection between two terminals of the semiconductor package.

According to another embodiment, the semiconductor assembly comprises a circuit carrier that comprises an electrically insulating substrate and a plurality of bond pads disposed on a main surface of the circuit carrier, an interposer that comprises an electrically insulating substrate, a plurality of upper contact pads disposed on an upper surface of the substrate, and a plurality of lower contact pads disposed on a lower surface of the substrate that is opposite from the upper surface, a semiconductor package that comprises a semiconductor die embedded within a package body and a plurality of package terminals that are exposed from the package body, and a first passive electrical element, wherein the interposer is mounted on the circuit carrier with the lower contact pads facing and electrically connected to the bond pads, wherein the semiconductor package is mounted on the interposer with the package terminals facing and electrically connected to the upper contact pads, and wherein the semiconductor package and the first passive electrical element are each electrically connected to the circuit carrier via the interposer.

Separately or in combination, the first passive electrical element is a discrete passive electrical element that is disposed over and overlaps with the semiconductor package.

Separately or in combination, the first passive electrical element comprises first and second terminals, the first terminal is electrically connected to the circuit carrier via the interposer, and the second terminal is electrically connected to a first one of the package terminals.

A method of producing a semiconductor assembly is disclosed. According to an embodiment, the method comprises providing an interposer that comprises an electrically insulating substrate, a plurality of upper contact pads disposed on an upper surface of the substrate, and a plurality of lower contact pads disposed on a lower surface of the substrate that is opposite from the upper surface, providing a semiconductor package that comprises a semiconductor die embedded within a package body and a plurality of package terminals that are exposed from the package body, providing a first passive electrical element that comprises first and second terminals, forming a first electrical connection between the first terminal of the first passive electrical element and a first one of the lower contact pads via the interposer, forming a second electrical connection between the second terminal of the first passive electrical element and a first one of the package terminals, and forming a third electrical connection between a second one of the package terminals and a second one of the lower contact pads via the interposer.

Separately or in combination, the method further comprises mounting the semiconductor package on the interposer such that the package terminals face and electrically connect with a group of the upper contact pads, and wherein at least some of the package terminals from the group are electrically connected to the lower contact pads via the interposer.

Separately or in combination, the first passive electrical element is a discrete passive electrical element, and wherein the method further comprises mounting the first passive electrical element over the semiconductor package such that the discrete passive electrical element overlaps with the semiconductor package.

Separately or in combination, forming the first electrical connection comprises providing a first conductive connector that vertically extends between a first one of the upper contact pads and a lower surface of the first passive electrical element, the first conductive connector mechanically supports the first conductive connector and electrically connects the first terminal of the first conductive connector to the first one of the upper contact pads, and the first one of the upper contact pads is electrically connected to the first one of the lower contact pads via the interposer.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 10, which includes

DETAILED DESCRIPTION

Embodiments of a semiconductor assembly that comprises an interposer, a semiconductor package, and a passive electrical element are described herein. The interposer is configured as an intermediary structure between the semiconductor package and a circuit carrier, e.g., a PCB (printed circuit board). This semiconductor assembly can form a power module with several advantages over existing designs. These advantages include improved space-efficiency on the circuit carrier because the interposer enables vertical stacking and/or overlap between the semiconductor package and the passive electrical element. These advantages additionally include reduced parasitic impacts such as parasitic inductance because the interconnections between the semiconductor package and the passive electrical element are short. These advantages additionally include increased reliability of the electrical connections in comparison to other interconnect solutions such as bond wires and metal clips. These advantages additionally include increased compatibility of a particular semiconductor package because the interposer can be configured to adapt the I/O footprint of the semiconductor many different circuit carriers.

Figure 1:
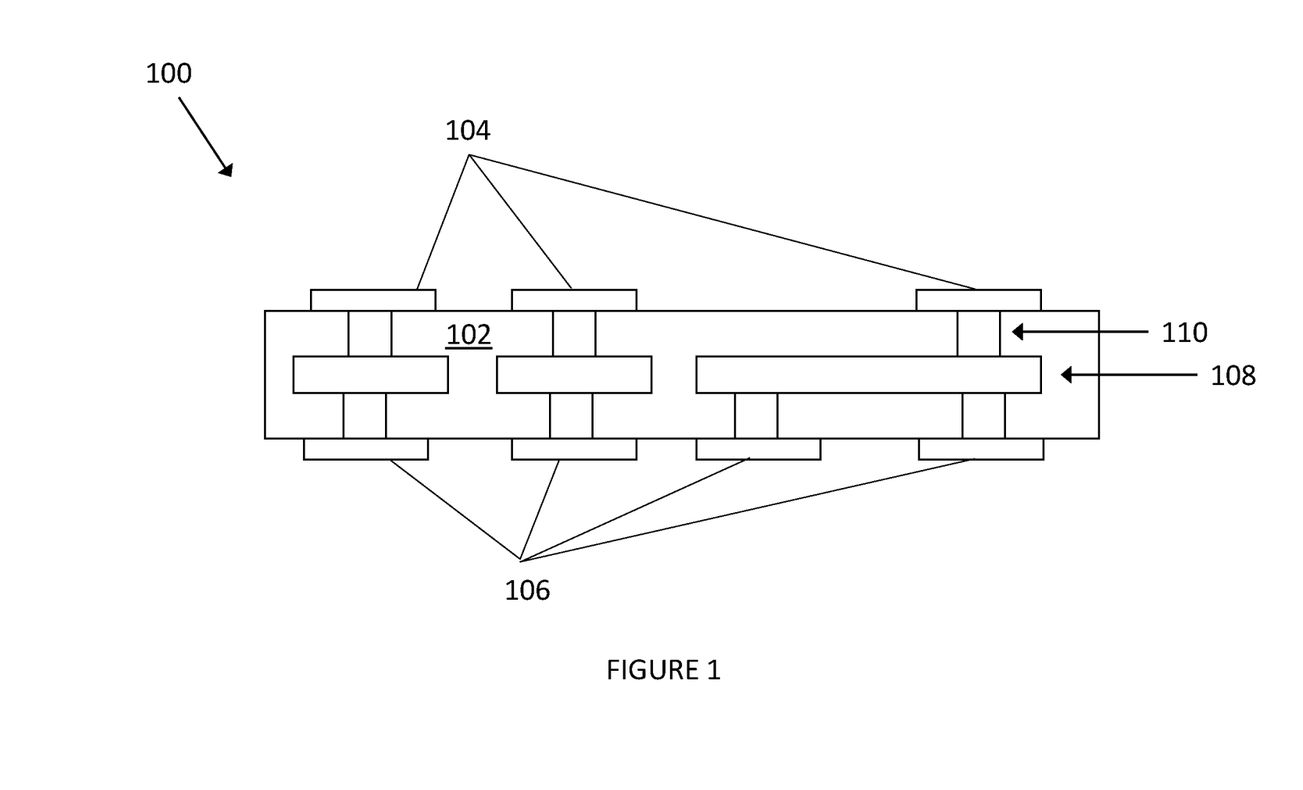
FIG. 1 illustrates an interposer, according to an embodiment.

Referring to FIG. 1, an interposer 100 is depicted, according to an embodiment. The interposer 100 comprises an electrically insulating substrate 102, a plurality of upper contact pads 104 disposed on an upper surface of the substrate 102, and a plurality of lower contact pads 106 disposed on a lower surface of the substrate 102 that is opposite from the upper surface. The interposer 100 is designed to be mounted on a circuit carrier, such as a PCB (printed circuit board), DBC (direct bonded copper) substrate, AMB (active metal brazed) substrate 102, etc. In this mounted position, the interposer 100 is designed to accommodate one or more electronic components (e.g., passive components, semiconductor dies, etc.) mounted on the upper surface of the substrate 102. The interposer 100 is configured to provide all necessary electrical connections between the electronic components mounted thereon and the circuit carrier. To this end, the interposer 100 comprises an internal network of interconnect lines 108 and vias 110 disposed between the upper and lower surfaces of the substrate 102. These interconnect lines 108 and vias 110 provide low-resistance electrical connections between the upper contact pads 104 and the lower contact pads 106. A simple example of this concept is shown in FIG. 1 wherein one of the upper contact pads 104 is electrically connected to two of the lower contact pads 106, and two of the upper contact pads 104 are each independently electrically connected to one of the lower contact pads 106. In general, any number of the upper contact pads 104 may be electrically connected to any number of the lower contact pads 106, and the location and routing of these electrical connections can be suitably adapted to meet the I/O and performance requirements of a particular application.

Generally speaking, the various elements of the interposer 100 can be constructed from any material that is suitable for semiconductor applications and formed according to any technique that is suitable for semiconductor applications. For instance, the substrate 102 can be formed from or comprise electrically insulating materials such as ceramics, epoxy materials, plastics, glass materials, oxides, nitrides, pre-peg materials, etc. The substrate 102 may also comprise a semiconductor material such as silicon, carbon, germanium, etc. The conductive features of the interposer 100 including the upper and lower contact pads 106, the interconnect lines 108 and vias 110 can be formed from or comprise any of a variety of conductive metals, e.g., copper, aluminium, zinc, tungsten, nickel, etc., and alloys thereof. According to an embodiment, the interconnect lines 108 and/or vias 110 comprise a metal plating of a corrosion resistant metal, such as copper. This metal plating be provided by electroplating or electroless plating, for example. This metal plating can make the electrical connections more robust against failure than corresponding electrical connections provided by bond wires.

The particular materials of the interposer 100 and processing techniques used to form the interposer 100 may depend on a variety of considerations such as cost, performance, ease of manufacture, etc. In one example, the interposer 100 can be constructed by PCB technology wherein the substrate 102 comprises a pre-peg material such as FR-4 with structured metallization layers providing the bond pads and internal connection lines. In another example, the interposer 100 can be constructed from a bulk semiconductor such as silicon and the various electrical structures are formed using standard semiconductor processing techniques.

The interposer 100 may be exclusively configured as a passive device that provides low-restive electrical connections between the upper and lower contact pads 104, 106. That is, the interposer 100 may be devoid of other electrical elements. Alternatively, the interposer 100 may comprise one or more active or passive electrical elements monolithically integrated therein. For example, passive electrical elements, e.g., resistors, capacitors, inductors, etc., can be formed in the interposer 100 through intentional geometric structuring of the interconnect lines 108 and/vias 110. Additionally, or alternatively, the interposer 100 may comprise semiconductor devices such as diodes, transistors, etc.

Figure 2:
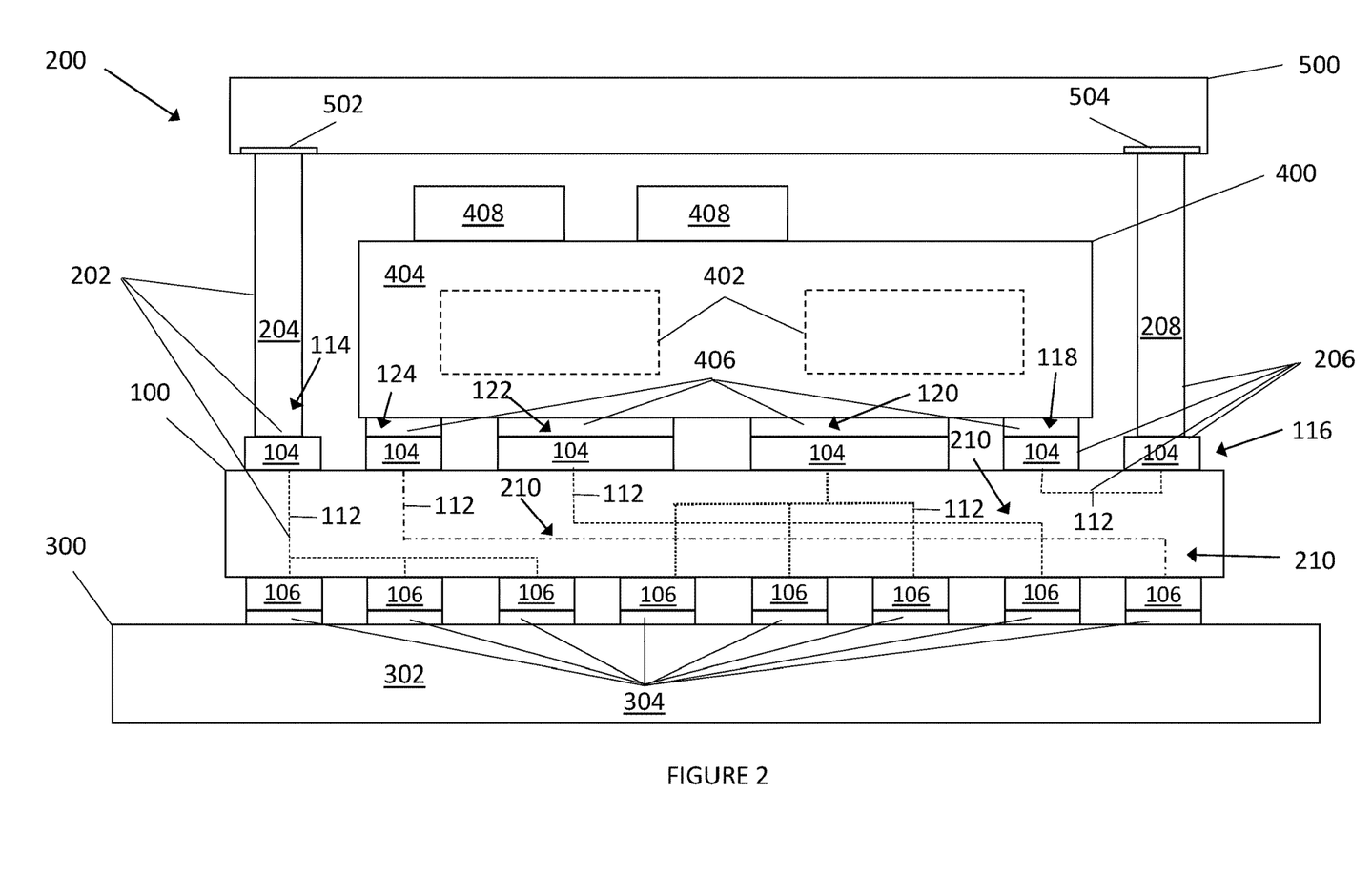
FIG. 2 illustrates a semiconductor assembly comprising a circuit carrier, an interposer mounted on the circuit carrier, and a semiconductor package and a discrete passive electrical element mounted on the interposer, according to an embodiment.

Referring to FIG. 2, a semiconductor assembly 200 that comprises the interposer 100 is depicted. The interposer 100 is mounted on a circuit carrier 300. The circuit carrier 300 comprises an electrically insulating substrate 302 and a plurality of bond pads 304 disposed on a main surface of the circuit carrier 300. The interposer 100 is mounted on the circuit carrier 300 with the lower contact pads 106 of the interposer 100 facing and electrically connected to corresponding bond pads 304 from the circuit carrier 300. A conductive intermediary material such as solder, sinter, glue, etc., may be provided between with the lower contact pads 106 and the bond pads 304 to effectuate these electrical connections.

Generally speaking, the circuit carrier 300 can be any electronics substrate 102 that is configured to mechanically support multiple electronic components, e.g., semiconductor packages, passives, heat sinks, etc., and to accommodate electrical connections between these electronic components. In an embodiment, the circuit carrier 300 is a printed circuit board (PCB). In that case, the electrically insulating substrate 302 can comprise pre-peg material such as FR-4, CEM-1, G-10, etc. and the bond pads 304 can be part of a structured metallization layer, e.g., a copper metallization layer, that also comprises signal traces. In another embodiment, the circuit carrier 300 can be a DBC (direct bonded copper) substrate. In that case, the electrically insulating substrate 302 can comprise a ceramic and the bond pads 304 can be part of a structured metallization layer, e.g., a copper metallization layer, that is bonded to the ceramic material by an oxidation technique. In other embodiments, the circuit carrier 300 is another type of power electronics substrate such as an AMB (active metal brazed) substrate, or an IMS (insulated metal substrate) substrate, for example.

The semiconductor assembly 200 further comprises a semiconductor package 400 mounted on the interposer 100. The semiconductor package 400 comprises one or more semiconductor dies 402 embedded within a package body 404 and a plurality of package terminals 406 that are exposed from the package body 404. The package terminals 406 are disposed on a main (lower) surface of the semiconductor package 400 and the semiconductor package 400 is mounted on the interposer 100 such that these package terminals 406 face and electrically connect with corresponding upper contact pads 104 from the interposer 100. A conductive intermediary material such as solder, sinter, glue, etc., may be provided between with the lower contact pads 106 and the bond pads 304 to effectuate these electrical connections.

According to an embodiment, the semiconductor package 400 is a laminated or so-called "chip-embedded" package. In contrast to a molded package type that comprises a monolithic region of mold compound that encapsulates a semiconductor die, a chip-embedded package comprises an encapsulant body formed from multiple constituent layers of dielectric material that are laminated (stacked) on top of one another. Each constituent laminate layer can generally comprise any dielectric material that is suitable for semiconductor device encapsulation. Examples of these dielectric materials include epoxy materials, blended epoxy and glass fiber materials such as FR-4, FR-5, CEM-4, etc., and resin materials such as bismaleimide trazine (BT) resin. A chip-embedded package typically also includes multiple layers of metallization, e.g., copper, aluminium, etc, and alloys thereof, formed on top of at least some of the constituent laminate layers. These layers of metallization can be structured to form internal interconnect lines within the package body 404 as well as the package terminals 406 that are exposed at the outer surfaces of the package body 404. Conductive vias, e.g., vias comprising tungsten, copper, etc., may be provided in openings that extend through the constituent layers of dielectric material to provide vertical electrical interconnect. Due to the electrical interconnect provided by the internal structured metallization, a chip-embedded package does not require a lead frame. Therefore, the semiconductor package 400 may be devoid of a die pad that accommodates the semiconductor dies 402 and/or devoid of conductive leads that are formed from the same lead frame structure as a die pad.

Generally speaking, the semiconductor dies 404 embedded within the package body 404 can have a wide variety of device configurations, e.g., discrete device configurations such as a MOSFET, IGBT, diode, etc., integrated circuit configurations such as a controller, driver, etc. The semiconductor dies 404 can comprise type IV semiconductor materials, e.g., as silicon, silicon germanium, silicon carbide, etc., and/or type III-V semiconductor materials, e.g., gallium nitride, gallium arsenide, etc. One or more of the semiconductor dies 404 may be configured as a vertical device that is configured to control a current flowing between a main surface and an opposite facing rear surface, or a lateral device that is configured to control a current flowing parallel to a main surface. One or more of the semiconductor dies 404 may be a discrete power device. A discrete power device refers to a discrete component that is rated to accommodate voltages of at least 100V and more commonly on the order of 500V or more and/or currents of at least 1 A and more commonly on the order of 10 A or more. Discrete power devices include MOSFETs (Metal Oxide Semiconductor Field Effect Transistors), IGBTs (Insulated Gate Bipolar Transistors), and HEMTs (High Electron Mobility Transistors), for example.

According to an embodiment, semiconductor package 400 is configured as a power module. This type of device comprises power switching devices (e.g., MOSFETs, IGBTs, HEMTs) and a driver die that controls a switching operation of these power switching devices. Thus, the semiconductor package 400 may comprise one or two of the semiconductor dies 404 that are configured as power switching devices and form a half-bridge circuit with a high-side switch and low-side switch connected in series with one another and a third one of the semiconductor dies 404 that is configured as a driver device (e.g., a CMOS logic device) that is configured to control a switching operation of the high-side switch and low-side switch.

The semiconductor assembly 200 further comprises a first passive electrical element 500 that comprises first and second terminals 502, 504. The first passive electrical element 500 can be any device that provides a defined electrical impedance e.g., resistance, capacitance, inductance, between the first and second terminals 502, 504.

In the depicted embodiment, the first passive electrical element 500 is configured as a discrete component, i.e., a standalone device that provides the defined electrical impedance between the first and second terminals 502, 504. The first passive electrical element 500 is mounted on the interposer 100 such that the first passive electrical element 500 is disposed over and overlaps with the semiconductor package 400. That is, the first passive electrical element 500 is directly above an upper surface of the semiconductor package 400 that faces away from the interposer 100.

The interposer 100 comprises multiple internal conduction paths 112. These conduction paths are schematically represented by dashed lines in FIG. 2. These internal conduction paths 112 can be formed by structuring of the interconnect lines 108 and vias 110 as described with reference to FIG. 1. Generally speaking, these internal conduction paths 112 can be between any combination of upper contact pads 104, the lower contact pads 106, or both. FIG. 1 illustrates just one specific example of a potential internal routing and the specifics of which will be described in further detail bow.

According to an embodiment, the semiconductor assembly 200 comprises a first electrical connection 202 between the first terminal 502 of the first passive electrical element 500 and at least one of the lower contact pads 106 via the interposer 100. As shown, the first terminal 502 of the first passive electrical element 500 is electrically connected to a first one 114 of the upper contact pads 104, which in turn is electrically connected to a group of the lower contact pads 106 by one of the internal conduction paths 112. In turn, this group of the lower contact pads 106 is electrically connected to a corresponding group of bond pads 304 from the carrier.

In the depicted embodiment, the first electrical connection 202 comprises a first conductive connector 204 that extends from the first terminal 502 of the first passive electrical element 500 to the first one 114 of the upper contact pads 104. The first conductive connector 204 can be a metal interconnect structure, such as a copper pillar or stud, that is designed to provide the necessary vertical standoff and mechanical support between the first passive electrical element 500 and the interposer 100. In another embodiment, the first passive electrical element 500 may comprise an elongated lead which forms the first terminal 502 of the first passive electrical element 502 and directly contacts the first one 114 of the upper contact pads 104.

According to an embodiment, the semiconductor assembly 200 comprises a second electrical connection 206 between the second terminal 504 of the first passive electrical element 500 and a first one of the package terminals 406. In the depicted embodiment, the second electrical connection 206 is provided via the interposer 100. More particularly, the second terminal 504 of the first passive electrical element 500 is electrically connected to a second one 116 of the upper contact pads 104, which in turn is electrically connected to a third one 118 of the upper contact pads 104 via one of the internal conduction paths 112 of the interposer 100. The semiconductor assembly 200 may further comprise a second conductive connector 208 that extends from the second terminal 504 of the first passive electrical element 500 to the second one 116 of the upper contact pads 104. The second conductive connector 208 can be a metal interconnect structure, such as a copper pillar or stud, that is designed to provide the necessary vertical standoff and mechanical support between the first passive electrical element 500 and the interposer 100. In another embodiment, the first passive electrical element 500 may comprise an elongated lead which forms the second terminal 504 of the first passive electrical element 502 and directly contacts the second one 116 of the upper contact pads 104.

According to an embodiment, the semiconductor assembly 200 comprises at least one third electrical connection 210 between the package terminals 406 and one of the lower contact pads 106 via the interposer 100. As shown, the semiconductor assembly 200 comprises multiple ones of the third electrical connections 210. Generally speaking, the third electrical connections 210 can correspond to some or all of the necessary electrical connections between the semiconductor package 400 and the circuit carrier 300.

In an embodiment of the semiconductor assembly 200 wherein the semiconductor package 400 is configured as a power module, the electrical connectivity of the assembly 200 can be as follows. The first passive electrical element 500 can be an inductor that is connected in series between the output of the power module and the circuit carrier 300. The output of the power module is provided at the first one of the package terminals 406, which is electrically connected to the second terminal 504 of the first passive electrical element 500 via the second electrical connection 206. The first terminal 502 of the first passive electrical element 500 is electrically connected to the circuit carrier 300 via the first electrical connection 202. The semiconductor assembly 200 comprises multiples ones of the third electrical connections 210 that provide all other necessary connections between the semiconductor dies 402 and the circuit board. For example, a second one 120 of the package terminals 406 can be electrically connected to a group of the bond pads 304 that provide an input voltage (Vin) to a high-side switch by one of the internal conduction paths 112 of the interposer 100, a third one 122 of the package terminals 406 can be electrically connected to a group of the bond pads 304 that provide a reference potential (GND) or negative voltage to a low-side switch by switch by one of the internal conduction paths 112 of the interposer 100, and a fourth one 124 of the package terminals 406 can be electrically connected to one of the bond pads 304 that provide a switching signal to the driver die by one of the internal conduction paths 112 of the interposer 100.

Optionally, the semiconductor package 400 may additionally comprise one or more second passive electrical elements 408 mounted on the upper surface of the semiconductor package 400 that is opposite from the interposer 100. The first passive electrical element 500 is disposed over and spaced apart from the second passive electrical elements 408. To this end, the vertical height of the first and second conductive connectors 204, 208 can be selected so that there is clearance between the bottom of the first passive electrical element 500 and the second passive electrical elements 408.

The second passive electrical elements 408 can be any type of passive deice, e.g., resistor, capacitor, inductor, etc. The second passive electrical elements 408 may be electrically connected to the semiconductor dies 404 embedded within the package body 404 by internal connections of the semiconductor package 400. In the case of a chip-embedded package, a structured metallization layer may be disposed on the upper surface of the semiconductor package 400 that is configured to accommodate these second passive electrical elements 408. Generally speaking, the second passive electrical elements 408 can be used to tune the operation of the semiconductor package 400 in a variety of different ways. For example, the second passive electrical elements 408 can be capacitors that are configured to provide input current buffering or supply current buffering to a power transistor or driver devices.

Figure 3:
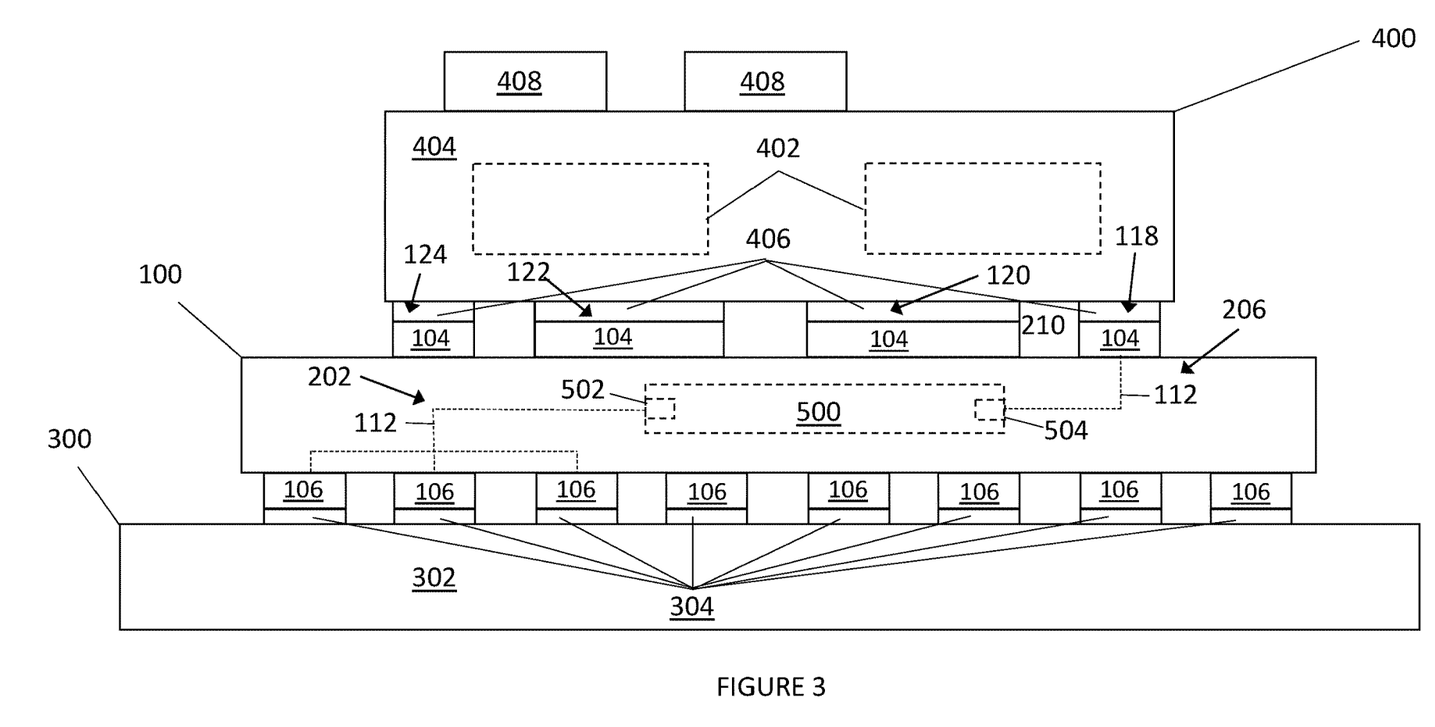
FIG. 3 illustrates a semiconductor assembly comprising a circuit carrier, an interposer mounted on the circuit carrier, a semiconductor package mounted on the interposer, and a passive electrical element monolithically integrated in the interposer, according to an embodiment.

Referring to FIG. 3, the semiconductor assembly 200 is depicted, according to another embodiment. In this embodiment, the first passive electrical element 500 is an integrally formed component of the interposer 100. The first and second terminals 502, 504 of the first passive electrical element 500 can be connected in the same way as described with reference to FIG. 2. This embodiment represents another way to use the interposer 100 to combine the semiconductor package 400 with a passive electrical element and form the necessary electrical connections with the circuit board in a space-efficient manner with low-parasitic impact.

Figure 4:
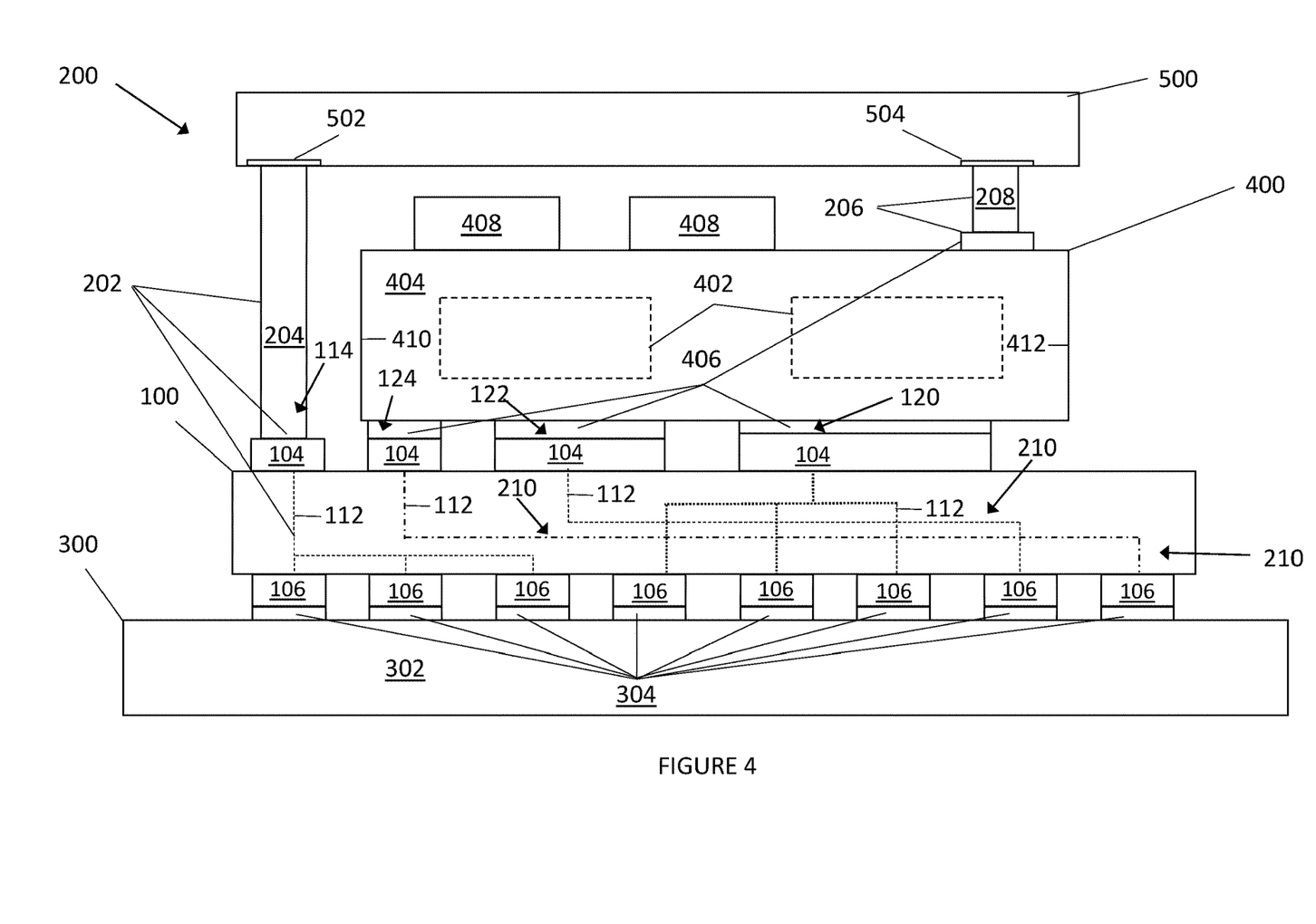
FIGS. 4-9 each illustrate a semiconductor assembly comprising a circuit carrier, an interposer mounted on the circuit carrier, and a semiconductor package and a discrete passive electrical element mounted on the interposer, according to an embodiment.

Referring to FIG. 4, the semiconductor assembly 200 is depicted, according to another embodiment. In this embodiment, the first one of the package terminals 406 is disposed on an upper side of the semiconductor package 400 that faces away from the interposer 100. In doing so, the second electrical connection 206 can comprise a second conductive connector 208 that directly connects with the first one of the package terminals 406. The second conductive connector 208 can be a conductive stud, bump or solder ball that is configured to create the necessary vertical standoff. The semiconductor assembly 200 of FIG. 4 eliminates the need for routing within the interposer 100 to connect the first passive electrical element 500 to the semiconductor package 400. As a result, a size reduction of the interposer 100 and is possible, which in turn enables a decrease in area required for the circuit carrier 300.

Figure 5:
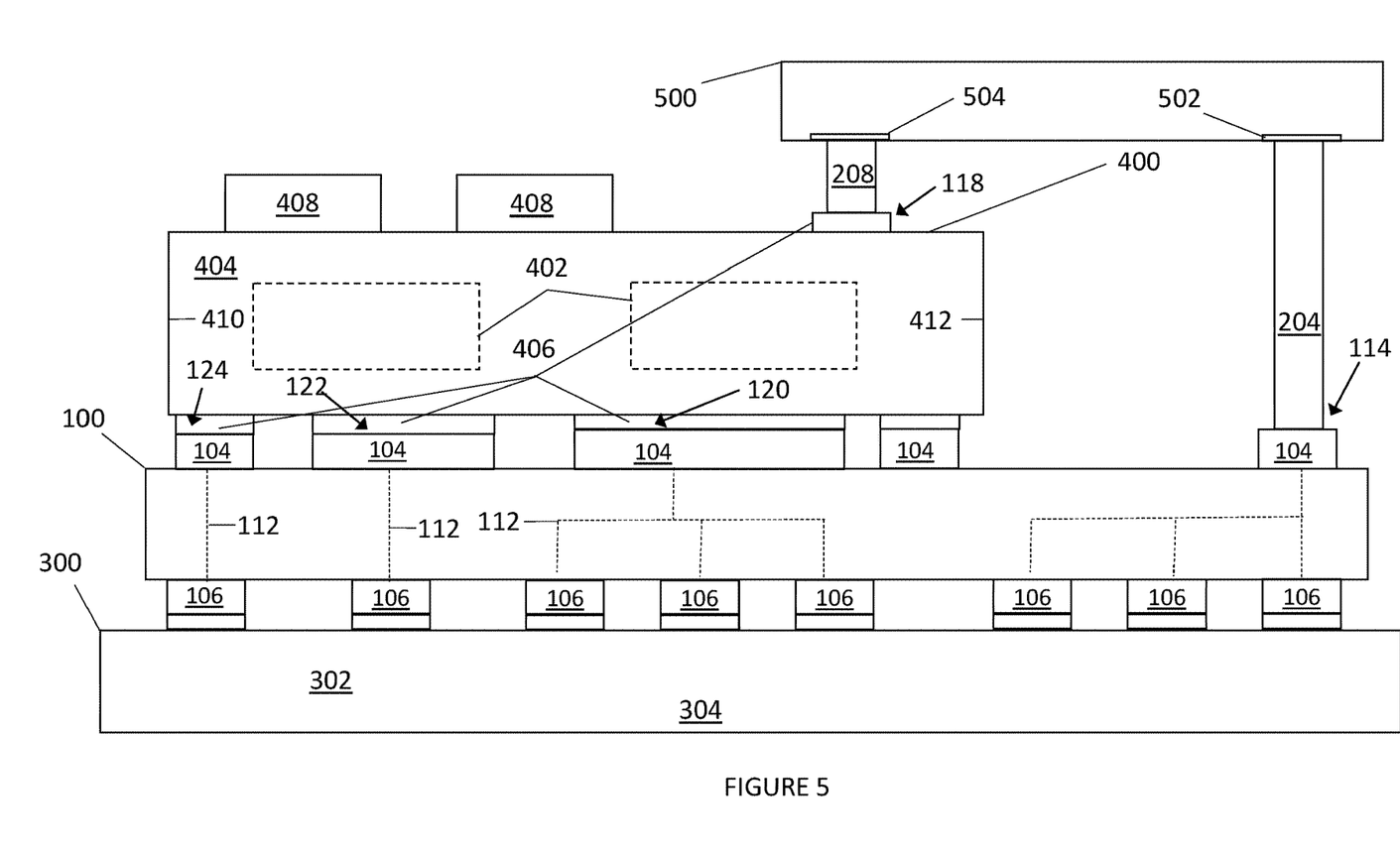

Referring to FIG. 5, the semiconductor assembly 200 is depicted, according to another embodiment. In this embodiment, the first passive electrical element 500 is rearranged and the interposer 100 is reconfigured. In the embodiment of FIG. 4, a first outer edge side 410 of the package body 404 faces the first conductive connector 204. The first outer edge side 410 of the package body 404 is further away from the first one of the package terminals 406 that connects with the first terminal 504 of the first passive electrical element 500.

By contrast, in the embodiment of FIG. 5, a second outer edge side 412 of the package body 404 that is closer to the first one of the package terminals 406 that connects with the first terminal 504 faces the first conductive connector 204. The semiconductor assembly 200 of FIG. 5 has less overlap between the first passive electrical element 500 and the semiconductor package 400 than previous embodiments and requires a larger lateral footprint for the interposer 100 than previous embodiments. However, this increased area may be beneficial in some cases by reducing congestion of the internal conduction paths 112 within the interposer 100. This can reduce production costs and/or allow for larger and hence more robust electrical connections.

Figure 6:
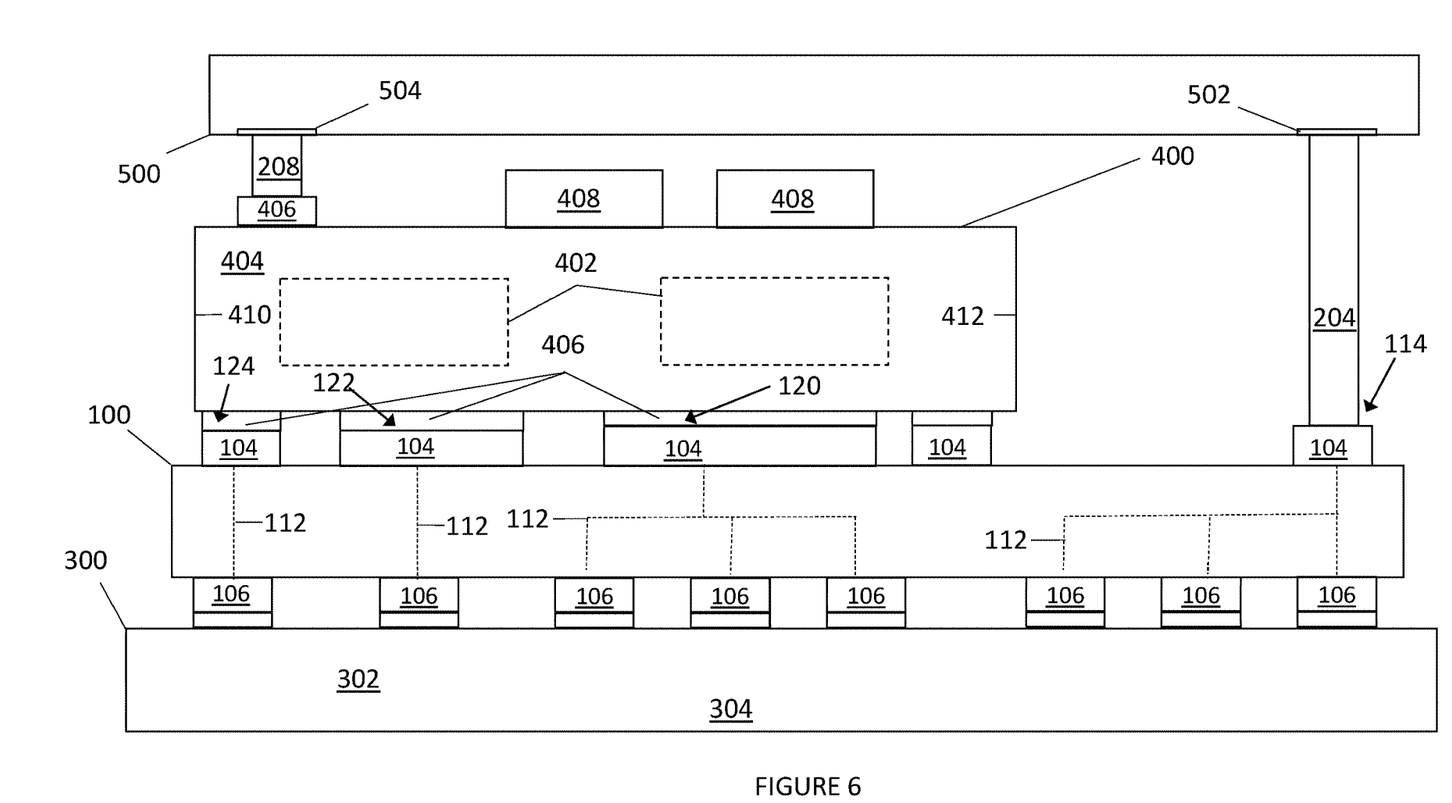

Referring to FIG. 6, the semiconductor assembly 200 is depicted, according to another embodiment. This embodiment of FIG. 6 is substantially identical to that of FIG. 5 except that the first one of the package terminals 406 that connects with the first terminal 504 is reoriented to be closer to the first outer edge side 410 of the package body 404 that faces away from the first conductive connector 204. In this arrangement, the first passive electrical element 500 can extend substantially across an entire length of the semiconductor package 400 and thus have more overlap. This may provide some of the improvement to congestion and/or the routing complexity of the internal conduction paths 112 as described with reference to the embodiment of FIG. 5 while improving space-efficiency.

Figure 7:
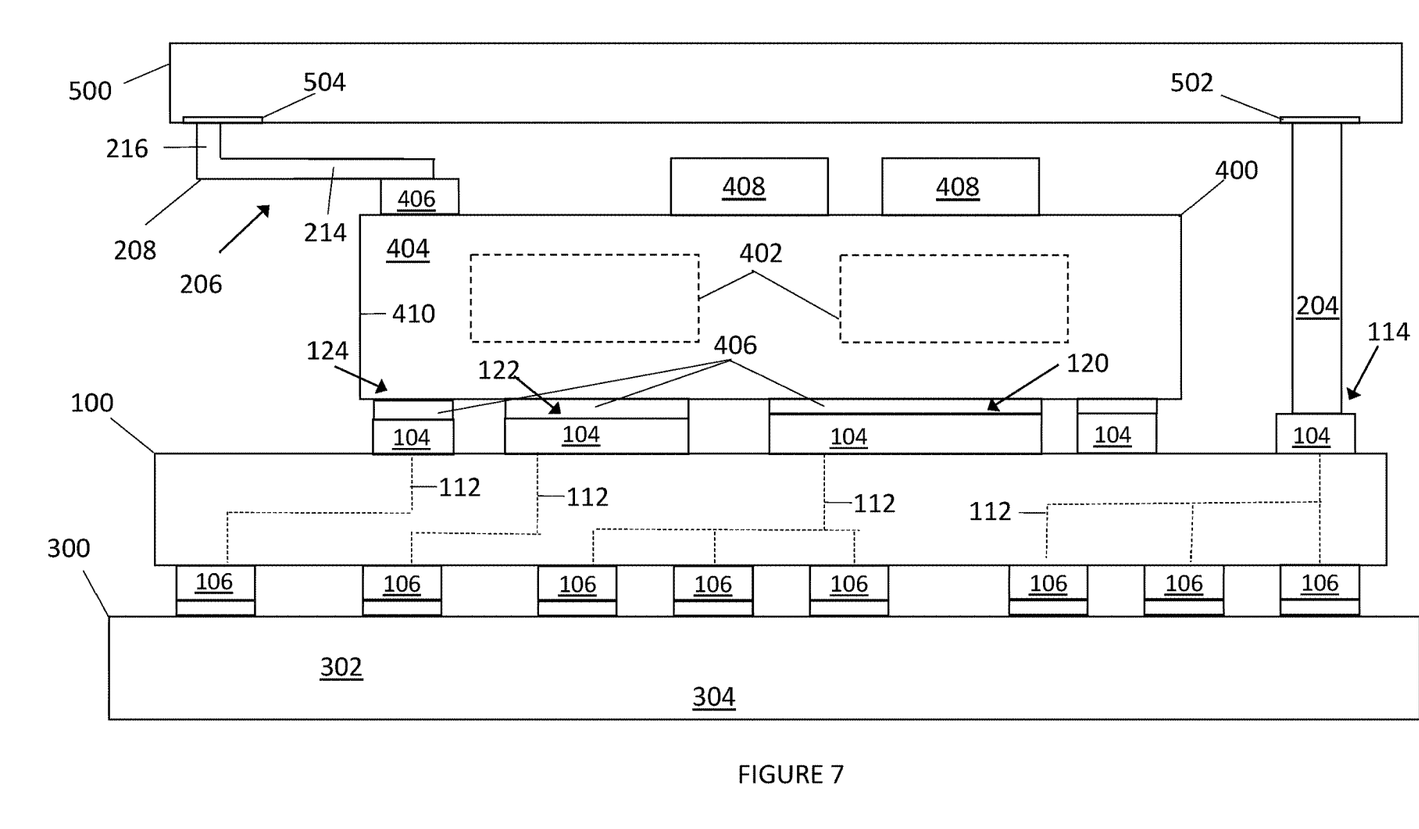

Referring to FIG. 7, the semiconductor assembly 200 is depicted, according to another embodiment. The embodiment of FIG. 7 is substantially identical to that of FIG. 6 except that the semiconductor package 400 is moved closer to the first conductive connector 204. For example, the semiconductor package 400 can be arranged such that the distance between the first one 114 of the upper contact pads 104 that connects with the first conductive connector 204 and the nearest one of the upper contact pads 104 than connects with one of the package terminals 406 corresponds to process-defined minimum separation distance for forming the interposer 100. In this arrangement, the first passive electrical element 500 can laterally overhang past the first outer edge side 410 of the semiconductor package 400.

The second electrical connection 206 is provided by a second conductive connector 208 that is electrically connected to the second terminal 504 of the first passive electrical element 500 and electrically contacts the first one of the package terminals 406. The second conductive connector 208 comprises a lateral section 214 that extends across the first outer edge side 410 of the semiconductor package 400 and a vertical section 216 that extends from the lateral section 214 to the lower surface of the first passive electrical element 500. The second conductive connector 208 can be an interconnect structure such as a metal clip that is connected to the second terminal 504 of the first passive electrical element 500 and the first one of the package terminals 406 by a conductive adhesive such as solder. Alternatively, the second conductive connector 208 can be a lead structure that is part of the first passive electrical element 500 itself and is directly connected to the first one of the package terminals 406 by a conductive adhesive such as solder.

Figure 8:
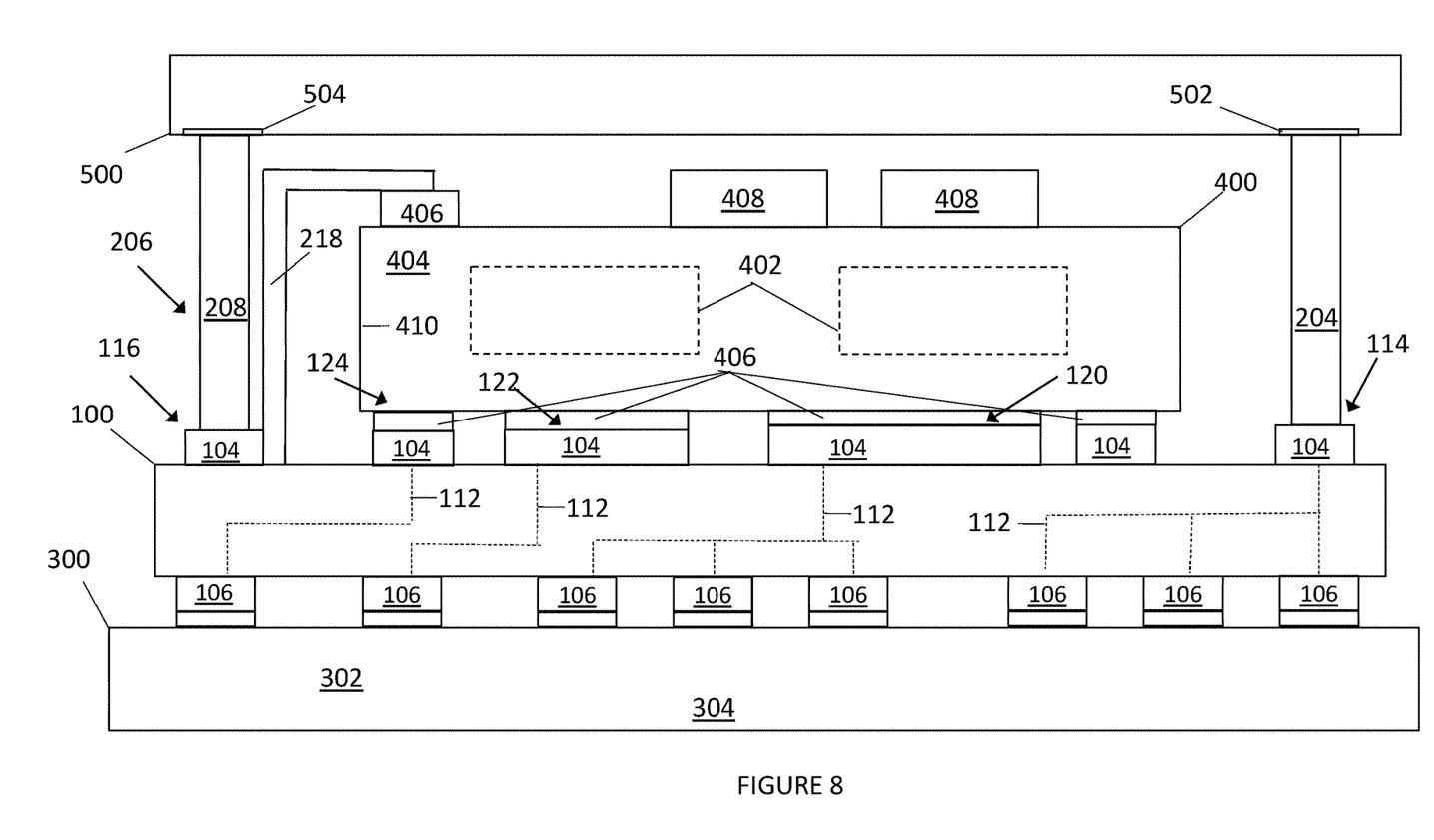

Referring to FIG. 8, the semiconductor assembly 200 is depicted, according to another embodiment. The embodiment of FIG. 8 is substantially identical to that of FIG. 7 except that the second electrical connection 206 comprises a second conductive connector 208 that is electrically connected to a second one 116 of the upper contact pads 104, which in turn is electrically connected to the first one of the package terminals 406 by a conductive metal clip 218 that is disposed outside of the semiconductor package 400. Thus, the second electrical connection 206 is effectuated without using the interconnect lines 108 and/or vias 110 within the interposer 100. The second conductive connector 208 and the metal clip 218 can form the necessary electrical connections by a conductive adhesive such as solder. This represents another way to effectuate the second electrical connection 206 while avoiding increased congestion of the internal conduction paths 112 within the interposer 100.

Figure 9:
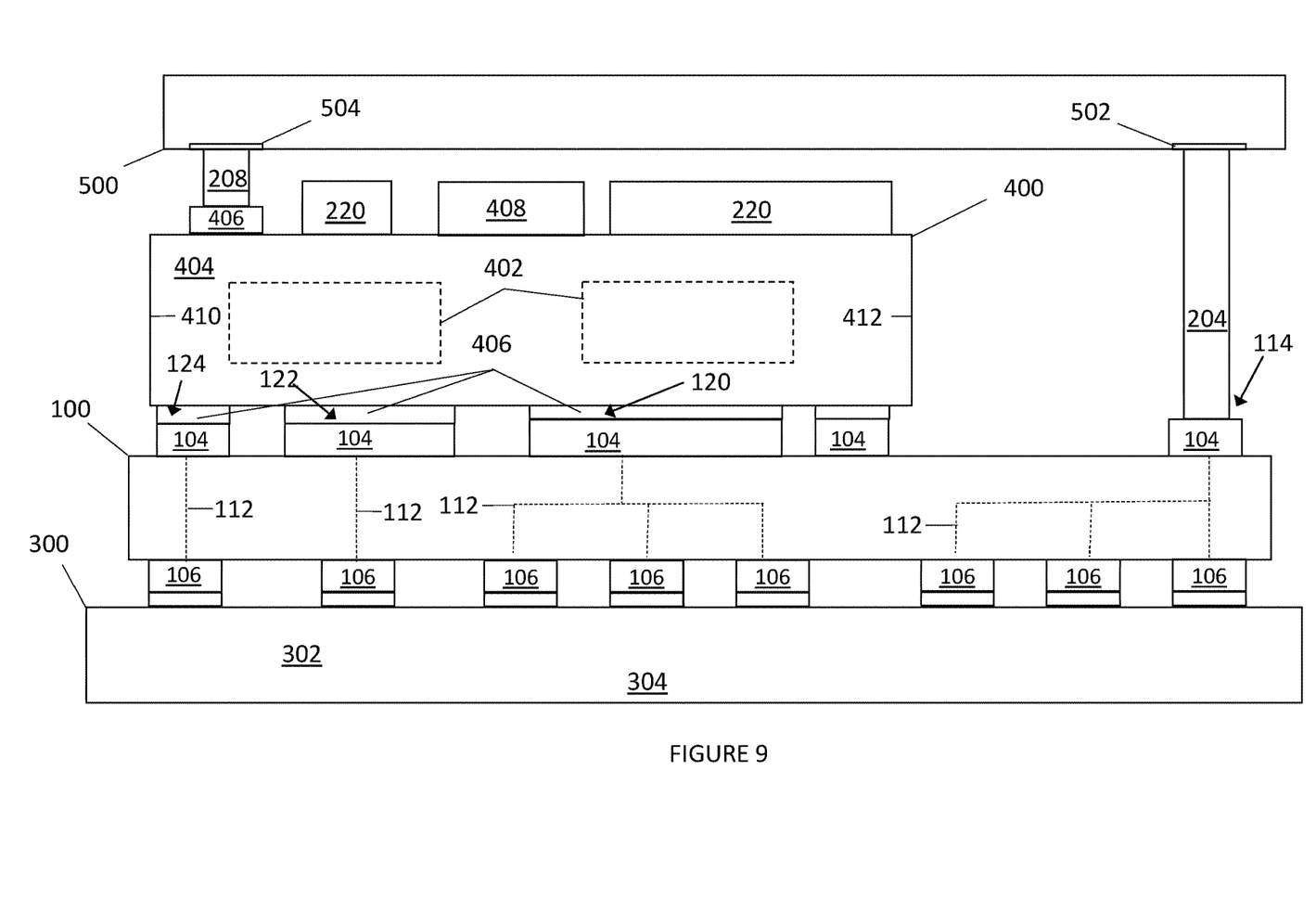
Figure 10A:
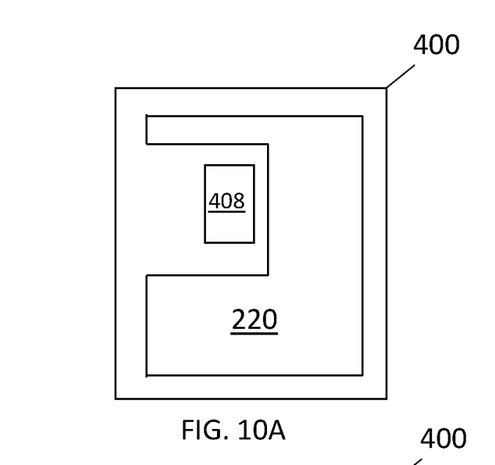
FIGS. 10A, 10B, 10C and 10D, illustrate a plan-view of a semiconductor package that comprises a metal clip and can be incorporated into the semiconductor assembly, according to various embodiments.
Figure 10B:
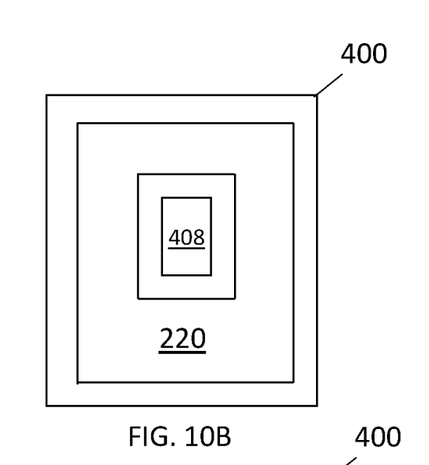
Figure 10C:
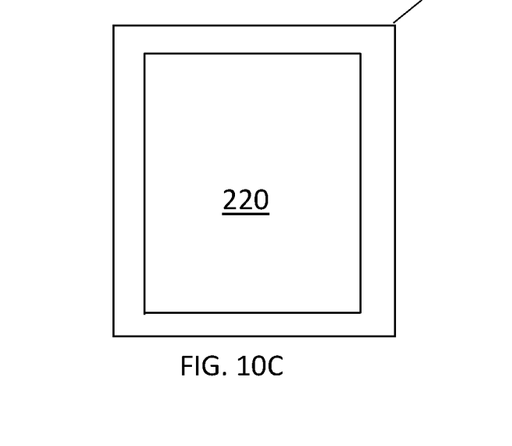
Figure 10D:
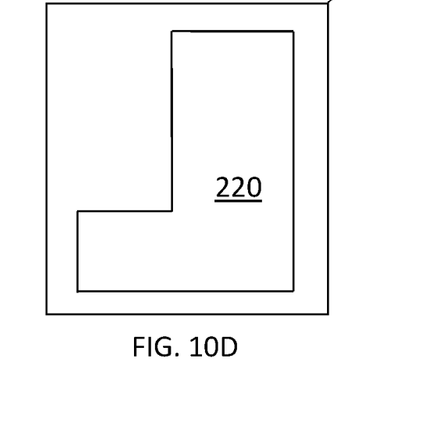

Referring to FIG. 9, the semiconductor assembly 200 is depicted, according to another embodiment. The embodiment of FIG. 9 is substantially identical to that of FIG. 6 except that a conductive metal clip 220 is provided on top of the semiconductor package 400. The conductive metal clip 220 can comprise or be formed from conductive metals such as copper, aluminium, etc., and alloys thereof. As shown, the conductive metal clip 220 is arranged to surround one of the second passive electrical elements 408. The conductive metal clip 220 may be electrically connected between two bond pads that are disposed on an upper surface of the semiconductor package 400 that is opposite from the interposer 100. If, for instance, the semiconductor package 400 is configured as a chip embedded package, these bond pads may be formed in a structured metallization layer that is formed on top of a laminate layer. The metal clip 220 may form an electrical interconnection between two internal terminals of the semiconductor package 400 to provide enhanced electrical and/or thermal performance in comparison to an arrangement wherein this electrical connection is provided by internal interconnections of the semiconductor package 400. For instance, in an embodiment wherein the semiconductor package 400 is configured as a power module, the metal clip 220 may form part of the drain-source connection, thereby leading to improved $R_{DSON}$ (drain-source on-resistance).

Referring to FIG. 10, various configurations for the conductive metal clip 220 in the semiconductor assembly 200 of FIG. 9 are shown from a plan-view perspective. FIGS. 10A and 10B depict two potential arrangements wherein the semiconductor package 400 includes a second passive electrical element 408 mounted on its upper surface, and the conductive metal clip 220 is arranged to surround the second passive electrical element 408. FIGS. 10C and 10D depict two potential arrangements wherein the upper surface of the semiconductor package 400 includes only the conductive metal clip 220 that covers a portion (in the case of FIG. 10D) or substantially all (in the case of FIG. 10C) of the upper surface of the semiconductor package 400. These embodiments may be used to obtain maximal thermal and/or electrical performance of the conductive metal clip 220.

The term "electrical connection" as used herein describes a low resistance electrical conduction path provided by one or more electrically conductive structures. An "electrical connection" may comprise multiple different electrically conductive structures such as bond pads 304, solder structures and interconnect lines 108.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor assembly, comprising:
   an interposer that comprises an electrically insulating substrate, a plurality of upper contact pads disposed on an upper surface of the substrate, and a plurality of lower contact pads disposed on a lower surface of the substrate that is opposite from the upper surface;
   a semiconductor package that comprises a semiconductor die embedded within a package body and a plurality of package terminals that are exposed from the package body;
   a first passive electrical element that comprises first and second terminals;
   a first electrical connection between the first terminal of the first passive electrical element and a first one of the lower contact pads via the interposer;
   a second electrical connection between the second terminal of the first passive electrical element and a first one of the package terminals; and
   a third electrical connection between a second one of the package terminals and a second one of the lower contact pads via the interposer.

2. The semiconductor assembly of claim 1, wherein the semiconductor package is mounted on the interposer such that the package terminals face and electrically connect with a group of the upper contact pads.

3. The semiconductor assembly of claim 1, wherein the first passive electrical element is a discrete passive electrical element that is disposed over and overlaps with the semiconductor package.

4. The semiconductor assembly of claim 3, wherein the first electrical connection comprises a first conductive connector that vertically extends between a first one of the upper contact pads and a lower surface of the first passive electrical element, and wherein the first one of the upper contact pads is electrically connected to the first one of the lower contact pads via the interposer.

5. The semiconductor assembly of claim 4, wherein the second electrical connection comprises a second conductive connector that vertically extends between a second one of the upper contact pads and the lower surface of the first passive electrical element, and wherein the second one of the upper contact pads is electrically connected to the first one of the package terminals via the interposer.

6. The semiconductor assembly of claim 4, wherein the first one of the package terminals is disposed on an upper side of the semiconductor package that faces away from the interposer.

7. The semiconductor assembly of claim 6, wherein the semiconductor package comprises first and second outer edge sides that are opposite to one another, wherein the first one of the package terminals is disposed closer to the second outer edge side, and wherein the first outer edge side faces the first conductive connector.

8. The semiconductor assembly of claim 6, wherein the semiconductor package comprises first and second outer edge sides that are opposite to one another, wherein the first one of the package terminals is disposed closer to the second outer edge side, and wherein the second outer edge side faces the first conductive connector.

9. The semiconductor assembly of claim 6, wherein the second electrical connection comprises a second conductive connector that vertically extends between a second one of the upper contact pads and the lower surface of the first passive electrical element, and wherein the second one of the upper contact pads is electrically connected to the first one of the package terminals by a first conductive clip that is disposed outside of the semiconductor package.

10. The semiconductor assembly of claim 6, wherein the second electrical connection comprises a second conductive connector that directly contacts the first one of the package terminals, and wherein the second conductive connector comprises a lateral section that extends across a first outer edge side of the semiconductor package and a vertical section that extends from the lateral section to the lower surface of the first passive electrical element.

11. The semiconductor assembly of claim 3, further comprising a second passive electrical element that is mounted on an upper surface of the semiconductor package, and wherein the first passive electrical element is disposed over and spaced apart from the second passive electrical element.

12. The semiconductor assembly of claim 1, wherein the first passive electrical element is integrally formed in the interposer.

13. The semiconductor assembly of claim 1, wherein the semiconductor package comprises a pair of power switching devices which form the high-side switch and low-side switch of a half-bridge circuit and a driver die configured to control the power switching devices, and wherein the first passive electrical element is an inductor that is connected in series between an output of the half-bridge circuit and the circuit carrier.

14. The semiconductor assembly of claim 1, wherein the semiconductor package comprises a conductive metal clip disposed on an upper surface of the semiconductor package that is opposite from the interposer, and wherein the conductive metal clip forms an electrical interconnection between two terminals of the semiconductor package.

15. A semiconductor assembly, comprising:
a circuit carrier that comprises an electrically insulating substrate and a plurality of bond pads disposed on a main surface of the circuit carrier;
an interposer that comprises an electrically insulating substrate, a plurality of upper contact pads disposed on an upper surface of the substrate, and a plurality of lower contact pads disposed on a lower surface of the substrate that is opposite from the upper surface;
a semiconductor package that comprises a semiconductor die embedded within a package body and a plurality of package terminals that are exposed from the package body; and
a first passive electrical element;
wherein the interposer is mounted on the circuit carrier with the lower contact pads facing and electrically connected to the bond pads,
wherein the semiconductor package is mounted on the interposer with the package terminals facing and electrically connected to the upper contact pads, and
wherein the semiconductor package and the first passive electrical element are each electrically connected to the circuit carrier via the interposer.

16. The semiconductor assembly of claim 15, wherein the first passive electrical element is a discrete passive electrical element that is disposed over and overlaps with the semiconductor package.

17. The semiconductor assembly of claim 15, wherein the first passive electrical element comprises first and second terminals, wherein the first terminal is electrically connected to the circuit carrier via the interposer, and wherein the second terminal is electrically connected to a first one of the package terminals.

\* \* \* \* \*

UNITED STATES PATENT AND TRADEMARK OFFICE
CERTIFICATE OF CORRECTION

| | |
|---|---|
| PATENT NO. | : 11,848,262 B2 |
| APPLICATION NO. | : 17/176678 |
| DATED | : December 19, 2023 |
| INVENTOR(S) | : A. Kessler et al. |

It is certified that error appears in the above-identified patent and that said Letters Patent is hereby corrected as shown below:

On the Title Page

(56) U.S. Pat. Documents, Column 2, Line 3, please change "Uo et al." to -- Luo et al. --

Signed and Sealed this
Twentieth Day of February, 2024

*Katherine Kelly Vidal*

Katherine Kelly Vidal
*Director of the United States Patent and Trademark Office*